United States Patent
Ooguri et al.

(10) Patent No.: US 11,149,193 B2
(45) Date of Patent: Oct. 19, 2021

(54) METHOD FOR PRODUCING CERAMIC COMPOSITE MATERIAL, CERAMIC COMPOSITE MATERIAL, AND LIGHT EMITTING DEVICE

(71) Applicant: NICHIA CORPORATION, Anan (JP)

(72) Inventors: Hirofumi Ooguri, Komatsushima (JP); Tomoya Fukui, Tokushima (JP); Tadayoshi Yanagihara, Tokushima (JP); Shigeki Yoshida, Anan (JP)

(73) Assignee: NICHIA CORPORATION, Anan (JP)

( * ) Notice: Subject to any disclaimer, the term of this patent is extended or adjusted under 35 U.S.C. 154(b) by 253 days.

(21) Appl. No.: 16/375,476

(22) Filed: Apr. 4, 2019

(65) Prior Publication Data

US 2019/0309221 A1 Oct. 10, 2019

(30) Foreign Application Priority Data

Apr. 6, 2018 (JP) ............... JP2018-073528
Aug. 29, 2018 (JP) ............... JP2018-160831

(51) Int. Cl.
| | |
|---|---|
| C09K 11/02 | (2006.01) |
| C09K 11/77 | (2006.01) |
| C09K 11/08 | (2006.01) |
| C04B 35/117 | (2006.01) |
| C04B 35/593 | (2006.01) |
| C04B 35/645 | (2006.01) |
| H01L 33/50 | (2010.01) |

(52) U.S. Cl.
CPC ............ *C09K 11/02* (2013.01); *C04B 35/117* (2013.01); *C04B 35/593* (2013.01); *C04B 35/6455* (2013.01); *C09K 11/0883* (2013.01); *C09K 11/7774* (2013.01); *C09K 11/77747* (2021.01); *H01L 33/502* (2013.01); *C04B 2235/3217* (2013.01); *C04B 2235/3222* (2013.01); *C04B 2235/3873* (2013.01); *C04B 2235/5436* (2013.01); *C04B 2235/656* (2013.01); *C04B 2235/661* (2013.01); *H01L 2933/0041* (2013.01)

(58) Field of Classification Search
CPC . C09K 11/02; C09K 11/7774; C09K 11/7747; H01L 33/502; H01L 2933/0041; C04B 35/117; C04B 35/6455; C04B 2238/661; C04B 2238/5436; C04B 2238/656; C04B 2238/77; C04B 2238/5445; C04B 2238/488; C04B 2238/4885
See application file for complete search history.

(56) References Cited

U.S. PATENT DOCUMENTS

| | | | |
|---|---|---|---|
| 7,902,564 B2 | 3/2011 | Mueller-Mach et al. | |
| 8,169,136 B2 | 5/2012 | Nakamura et al. | |
| 8,502,442 B2 | 8/2013 | Nakamura et al. | |
| 9,605,201 B2 | 3/2017 | Yamaguchi | |
| 10,267,963 B2 | 4/2019 | Fujita et al. | |
| 2005/0156496 A1 | 7/2005 | Takashima et al. | |
| 2008/0149956 A1 | 6/2008 | Mueller-Mach et al. | |
| 2008/0258110 A1 | 10/2008 | Oshio | |
| 2009/0212697 A1 | 8/2009 | Nakamura et al. | |
| 2011/0084293 A1 | 4/2011 | Mueller-Mach et al. | |
| 2012/0194066 A1 | 8/2012 | Nakamura et al. | |
| 2013/0280520 A1 | 10/2013 | Pan et al. | |
| 2015/0184070 A1 | 7/2015 | Kim et al. | |
| 2015/0219291 A1 | 8/2015 | Yamaguchi | |
| 2017/0321866 A1 | 11/2017 | Asami et al. | |
| 2018/0275324 A1 | 9/2018 | Fujita et al. | |
| 2019/0031956 A1 | 1/2019 | Inata et al. | |
| 2019/0153315 A1* | 5/2019 | Harada | ................ F21S 43/10 |

FOREIGN PATENT DOCUMENTS

| | | |
|---|---|---|
| EP | 1670070 A1 | 6/2006 |
| JP | 2009091546 A | 4/2009 |
| JP | 2009096653 A | 5/2009 |
| JP | 2010514189 A | 4/2010 |

(Continued)

OTHER PUBLICATIONS

Machine translation of JP-2009091546-A, 23 pages. (Year: 2009).
Non-Final Office Action, United States Patent and Trademark Office, issued to U.S. Appl. No. 16/212,450 dated Oct. 1, 2021, 18 pages.
Final Office Action, United States Patent and Trademark Office, issued to U.S. Appl. No. 16/212,450 dated Mar. 18, 2021, 14 pages.

* cited by examiner

*Primary Examiner* — C Melissa Koslow
(74) *Attorney, Agent, or Firm* — Hunton Andrews Kurth LLP

(57) ABSTRACT

Provided are a method for producing a ceramic composite material that has a high light emission intensity, a ceramic composite material, and a light emitting device. The method for producing a ceramic composite material, includes: preparing a green body containing a nitride fluorescent material having a composition represented by the following chemical formula (I) and aluminum oxide particles mixed with each other; and performing primary sintering the green body at a temperature in a range of 1,250° C. or more and 1,600° C. or less to provide a first sintered body:

$$M_w Ln^1_x A_y N_z \qquad (I)$$

wherein in the chemical formula (I), M represents at least one element selected from the group consisting of Ce and Pr; $Ln^1$ represents at least one element selected from the group consisting of Sc, Y, La, Nd, Sm, Eu, Gd, Tb, Dy, Ho, Er, Tm, Yb, and Lu; A represents at least one element selected from the group consisting of Si and B; and w, x, y, and z each satisfy $0 < w \leq 1.0$, $2.5 \leq x \leq 3.5$, $5.5 \leq y \leq 6.5$, and $10 \leq z \leq 12$.

16 Claims, 6 Drawing Sheets

(56) References Cited

FOREIGN PATENT DOCUMENTS

| | | |
|---|---|---|
| JP | 2011513898 A | 4/2011 |
| JP | 2014201726 A | 10/2014 |
| JP | 2014234487 A | 12/2014 |
| JP | 2015149394 A | 8/2015 |
| JP | 2015199640 A | 11/2015 |
| JP | 2016119383 A | 6/2016 |
| JP | 2016180076 A | 10/2016 |
| JP | 2017107071 A | 6/2017 |
| JP | 2018021193 A | 2/2018 |
| JP | 2018043912 A | 3/2018 |
| WO | 2016117623 A1 | 7/2016 |
| WO | 2017170609 A1 | 10/2017 |
| WO | 2018021418 A1 | 2/2018 |
| WO | WO 2018/021418 * | 2/2018 | ary
METHOD FOR PRODUCING CERAMIC COMPOSITE MATERIAL, CERAMIC COMPOSITE MATERIAL, AND LIGHT EMITTING DEVICE

CROSS-REFERENCE TO RELATED PATENT APPLICATION

This application claims priority to Japanese Patent Application No. 2018-073528, filed on Apr. 6, 2018, and Japanese Patent Application No. 2018-160831, filed on Aug. 29, 2018, the entire disclosures of which are incorporated herein by references in their entirety.

BACKGROUND

Technical Field

The present invention relates to a method for producing a ceramic composite material that converts light emitted from a light emitting diode (which may be hereinafter referred to as "LED") and a laser diode (which may be hereinafter referred to as "LD") to light having a different wavelength, a ceramic composite material, and a light emitting device.

Description of Related Art

A light emitting device using a light emitting element, such as LED and LD, is a light source having a high conversion efficiency, and is being utilized as a light source substituting an incandescent lamp and a fluorescent lamp due to the small electric power consumption, the long lifetime, and the capability of size reduction. A light emitting device using LED or LD has been used in a wide variety of fields including a light emitting device of automobile use and indoor lighting, a backlight source for a liquid crystal display device, a luminary, a light source device for a projector, and the like. In particular, a light emitting device having a combination of a light emitting element and a fluorescent material and emitting mixed light thereof is being widely used.

Examples of a known fluorescent material used in the light emitting device include inorganic fluorescent materials, such as a rare earth aluminate salt fluorescent material represented by $(Y,Gd,Tb,Lu)_3(Al,Ga)_5O_{12}:Ce$, a silicate fluorescent material represented by $(Sr,Ca,Ba)_2SiO_4:Eu$, and a nitride fluorescent material represented by $Ln_3Si_6N_{11}:Ce$ (wherein Ln represents a rare earth element other than the activator). In this specification, the "fluorescent material" is used in the same meaning as a "fluorescent phosphor". International Unexamined Patent Publication No. 2016/117623 discloses as a ceramic composite material containing the inorganic fluorescent material, for example, a ceramic composite material obtained by sintering a fluoride inorganic binder and inorganic fluorescent material powder.

However, the ceramic composite material described in International Unexamined Patent Publication No. 2016/117623 contains a fluoride as a binder, and thus has a poor thermal conductivity and a concern about a low light emission intensity.

SUMMARY

An object of one embodiment of the present disclosure is to provide a method for producing a ceramic composite material that has a high light emission intensity, a ceramic composite material, and a light emitting device.

A first embodiment of the present disclosure is a method for producing a ceramic composite material, including: preparing a green body containing a nitride fluorescent material having a composition represented by the following chemical formula (I) and aluminum oxide particles mixed with each other; and primary sintering the green body at a temperature in a range of 1,250° C. or more and 1,600° C. or less, so as to obtain a first sintered body.

A second embodiment of the present disclosure is a ceramic composite material containing a nitride fluorescent material having a composition represented by the following chemical formula (I) and aluminum oxide, having a content of the nitride fluorescent material in a range of 0.1% by mass or more and 70% by mass or less based on the total amount of the nitride fluorescent material and the aluminum oxide.

$$M_w Ln^1_x A_y N_z \tag{I}$$

In the chemical formula (I), M represents at least one element selected from the group consisting of Ce and Pr; $Ln^1$ represents at least one element selected from the group consisting of Sc, Y, La, Nd, Sm, Eu, Gd, Tb, Dy, Ho, Er, Tm, Yb, and Lu; A represents at least one element selected from the group consisting of Si and B; and w, x, y, and z each satisfy $0<w\leq1.0$, $2.5\leq x\leq 3.5$, $5.5\leq y\leq 6.5$, and $10\leq z\leq 12$.

A third embodiment of the present disclosure is a light emitting device including the ceramic composite material and a light emitting element having a light emission peak wavelength in a range of 350 nm or more and 500 nm or less.

According to the embodiments of the present disclosure, a method for producing a ceramic composite material that has a high light emission intensity, a ceramic composite material, and a light emitting device can be provided.

DETAILED DESCRIPTION

Figure 1:
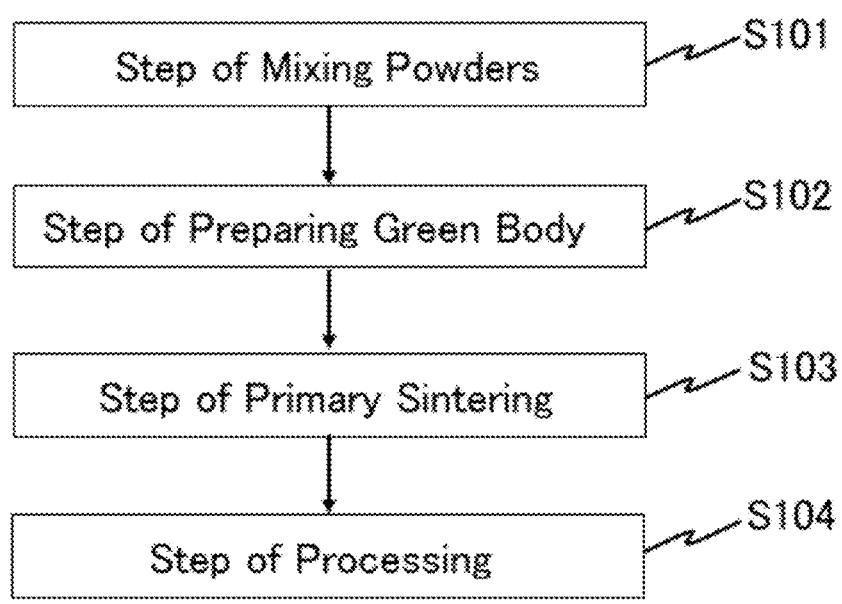
FIG. 1 is a flow chart showing an example of the order of the process steps of the method for producing a ceramic composite material according to the first embodiment of the present disclosure.

The method for producing a ceramic composite material and the ceramic composite material according to the present invention will be described with reference to embodiments below. However, the embodiments shown below are only examples for practicing the technical concept of the present invention, and the present invention is not limited to the method for producing a ceramic composite material and the ceramic composite material shown below. The relationships between the color names and the chromaticity coordinates, the relationships between the wavelength range of light and the color names of monochromic light, and the like are in accordance with Japanese Industrial Standard (JIS) Z8110.

The method for producing a ceramic composite material according to the first embodiment of the present disclosure includes: preparing a green body containing a nitride fluorescent material having a composition represented by the following chemical formula (I) and aluminum oxide particles mixed with each other; and primary sintering the green body at a temperature in a range of 1,250° C. or more and 1,600° C. or less, so as to obtain a first sintered body. Aluminum oxide can be used as ceramic.

$$M_w Ln^1_x A_y N_z \qquad (I)$$

In the chemical formula (I), M represents at least one element selected from the group consisting of Ce and Pr; $Ln^1$ represents at least one element selected from the group consisting of Sc, Y, La, Nd, Sm, Eu, Gd, Tb, Dy, Ho, Er, Tm, Yb, and Lu; A represents at least one element selected from the group consisting of Si and B; and w, x, y, and z each satisfy $0<w\leq1.0$, $2.5\leq x\leq3.5$, $5.5\leq y\leq6.5$, and $10\leq z\leq12$.

In the method for producing a ceramic composite material according to the first embodiment of the present disclosure, a green body containing a rare earth aluminate salt fluorescent material having a composition represented by the following chemical formula (II) mixed therewith may be prepared in the step of preparing a green body.

$$(Ln^2_{1-a}Ce_a)_3(Al_c Ga_b)_5 O_{12} \qquad (II)$$

In the chemical formula (II), $Ln^2$ represents at least one element selected from the group consisting of Y, Gd, Lu, and Tb; and a, b, and c each satisfy $0<a\leq0.022$, $0\leq b\leq0.4$, $0<c\leq1.1$, and $0.9\leq b+c\leq1.1$.

According to the production method according to the first embodiment of the present disclosure, the aluminum oxide particle contained in the green body are fusion bonded to each other through the primary sintering, so as to form a base material of a ceramic composite material. Aluminum oxide can be sintering at a relatively high temperature exceeding 1,250° C., as compared to other oxides, such as titanium oxide and zirconium oxide. Aluminum oxide is difficult to receive structural changes with heat, and oxygen released from the composition of aluminum oxide and nitrogen in the nitride fluorescent material having a composition represented by the chemical formula (I) are difficult to react with each other. Therefore, it is estimated that defects that adversely affect the light emission of the nitride fluorescent material are difficult to form, resulting in a ceramic composite material having a high light emission intensity. Furthermore, the first sintered body is obtained through the primary sintering at a temperature, at which the surfaces of the aluminum oxide particles can be fusion bonded, and thereby the first sintered body containing the nitride fluorescent material, or the nitride fluorescent material and the rare earth aluminate salt fluorescent material, in the aluminum oxide as the base material can be obtained while suppressing the formation of defects in the nitride fluorescent material. The resulting first sintered body is formed of aluminum oxide having a high thermal conductivity as the base material, and thus has a high thermal conductivity and less adversely affects the fluorescent material with heat. The nitride fluorescent material having a composition represented by the chemical formula (I) or the rare earth aluminate salt fluorescent material having a composition represented by the chemical formula (II) is contained in the base material formed through fusion bonding of the surfaces of the aluminum oxide particles, and thereby the deterioration thereof with moisture or oxidation in air can be suppressed.

While the thermal conductivity of aluminum oxide varies depending on the kind of aluminum oxide, aluminum oxide has a high thermal conductivity in a range of 30 W/m·k or more and 40 W/m·k or less. Calcium fluoride has a thermal conductivity of approximately 9.7 W/m·k, magnesium fluoride has a thermal conductivity of approximately 0.3 W/m·k, and zirconium oxide has a thermal conductivity of approximately 3.0 W/m·k. Aluminum oxide has a higher thermal conductivity than these fluorides.

Nitride Fluorescent Material

The nitride fluorescent material has a composition represented by the chemical formula (I), and in the chemical formula (I), the element M is preferably Ce. In the chemical formula (I), the value of parameter w shows the molar ratio of the element M. In the description herein, the "molar ratio" in the chemical formulae shows the molar ratio of the element in 1 mol of the chemical composition represented by the chemical formula. In the chemical formula (I), the value of parameter w is a number that satisfies more than 0 and 1.0 or less ($0<w\leq1.0$), preferably in a range of 0.001 or more and 0.9 or less ($0.001\leq w\leq0.9$), more preferably in a range of 0.002 or more and 0.8 or less ($0.002\leq w\leq0.8$), and further preferably in a range of 0.003 or more and 0.7 or less ($0.003\leq w\leq0.7$).

In the composition represented by the chemical formula (I), the element $Ln^1$ is preferably at least one element selected from the group consisting of La, Nd, Sm, Eu, Gd, Tb, Er, and Lu, and more preferably represents at least one element selected from the group consisting of La, Eu, Gd, Tb, and Lu. In the chemical formula (I), the parameter x shows the molar ratio of the element $Ln^1$. In the chemical formula (I), the parameter x satisfies in a range of 2.5 or more and 3.5 or less ($2.5\leq x\leq3.5$), preferably in a range of 2.6 or more and 3.4 or less ($2.6\leq x\leq3.4$), and more preferably in a range of 2.7 or more and 3.3 or less ($2.7\leq x\leq3.3$).

In the composition represented by the chemical formula (I), the element A is preferably Si. In the composition represented by the chemical formula (I), the parameter y shows the molar ratio of the element A. In the chemical formula (I), the parameter y satisfies in a range of 5.5 or more and 6.5 or less ($5.5\leq y\leq6.5$), preferably in a range of 5.6 or more and 6.4 or less ($5.6\leq y\leq6.4$), more preferably in a range of 5.7 or more and 6.3 or less ($5.7\leq y\leq6.3$), and further preferably in a range of 5.8 or more and 6.2 or less ($5.8\leq y\leq6.2$). In the chemical formula (I), the parameter z showing the molar ratio of nitrogen (N) satisfies preferably in a range of 10.5 or more and 11.5 or less ($10.5\leq z\leq11.5$).

The nitride fluorescent material having a composition represented by the chemical formula (I) preferably has a median particle diameter in a range of 2 µm or more and 100 µm or less. The median particle diameter of the nitride fluorescent material having a composition represented by the chemical formula (I) is more preferably in a range of 3 µm or more and 50 µm or less, and further preferably 5 µm or more and 30 µm or less. In the case where the median particle diameter of the nitride fluorescent material is 2 µm or more, the nitride fluorescent material can be substantially uniformly dispersed in the green body. In the case where the median particle diameter of the nitride fluorescent material is 100 µm or less, the first sintered body may have less voids, resulting in a high light emission intensity. Herein, the median particle diameter of the nitride fluorescent material means a particle diameter where the volume cumulative frequency from the small diameter side in the particle size distribution on volume basis by a laser diffractive scattering particle size distribution measuring method reaches 50% (median diameter). In the laser diffractive scattering particle size distribution measuring method, the measurement may be performed, for example, with a laser diffractive scattering particle size distribution measuring apparatus (Master Sizer 3000, manufactured by Malvern Instruments Ltd.).

In the step of preparing a green body, the amount of the nitride fluorescent material having a composition represented by the chemical formula (I) used is preferably ratio in a range of 0.1% by mass or more and 70% by mass or less, more preferably in a range of 0.5% by mass or more and 50% by mass or less, further preferably in a range of 0.8% by mass or more and 40% by mass or less, and still further preferably in a range of 1% by mass or more and 30% by mass or less, based on 100% by mass of the green body. The nitride fluorescent material having a composition represented by the chemical formula (I) is preferably in the form of powder. In the case where the ratio of the nitride fluorescent material having a composition represented by the chemical formula (I) is in a range of 0.1% by mass or more and 70% by mass or less based on 100% by mass of the green body, a ceramic composite material having a high light emission intensity can be obtained. In the case where the ratio of the nitride fluorescent material is in a range of 0.1% by mass or more based on 100% by mass of the green body, the content of the nitride fluorescent material can be increased to provide a ceramic composite material having a high light emission intensity. In the case where the ratio of the nitride fluorescent material is 70% by mass or less based on 100% by mass of the green body, the amount of the aluminum oxide particles can be relatively large, and the amount of aluminum oxide constituting the base material of the first sintered body can be increased to increase the density of the first sintered body, resulting in increase of the mechanical strength. In the case where the ratio of the nitride fluorescent material is 70% by mass or less, the ratio of the powder of the nitride fluorescent material per unit volume of the ceramic composite material can be decreased, and, for example, in order to obtain a desired color tone or light emission intensity, the thickness of the ceramic composite material can be set to a prescribed value, so that a desired strength can be obtained, which is advantageous in handleability. The mass ratio (% by mass) of the nitride fluorescent material in the ceramic composite material is the same as the mixed amount (% by mass) of the nitride fluorescent material in 100% by mass of the green body or 100% by mass of the mixed powder.

In the case where the rare earth aluminate salt fluorescent material represented by the chemical formula (II) described later is contained in the green body or the ceramic composite material in addition to the nitride fluorescent material having a composition represented by the chemical formula (I), the content of the nitride fluorescent material is preferably 15% by mass or more, and more preferably 20% by mass or more, may be 100% by mass, and may be 99% by mass or less, based on the total amount of 100% by mass of the nitride fluorescent material and the rare earth aluminate salt fluorescent material. In the case where the content of the nitride fluorescent material is 15% by mass or more based on the total amount of 100% by mass of the nitride fluorescent material and the rare earth aluminate salt fluorescent material, the light emission intensity can be suppressed from being decreased even in the case of the use under an environment of high temperature, for example, of 150° C. or more, so as to provide a ceramic composite material that retains the high light emission intensity. The amount of the nitride fluorescent material based on the total amount of 100% by mass of the nitride fluorescent material and the rare earth aluminate salt fluorescent material does not change in each of the mixed powder, the green body obtained by molding the mixed powder, and the first sintered body or the second sintered body obtained by sintering the green body, and is the same as the ratio (% by mass) thereof mixed in the mixed powder or the green body.

Aluminum Oxide Particles

The aluminum oxide particles preferably have a purity of aluminum oxide of 99.0% by mass or more, and the purity of aluminum oxide is more preferably 99.5% by mass or more. In the case where the green body contains the aluminum oxide particles having a purity of aluminum oxide of 99.0% by mass or more, the reaction of the aluminum oxide particles and the nitride fluorescent material is suppressed due to the small amounts of organic materials and water contained in the aluminum oxide particles, and thereby the transparency of the first sintered body and the second sintered body thus obtained can be increased to increase the light emission intensity, resulting in the ceramic composite material having a good thermal conductivity. In the case where commercially available aluminum oxide particles are used, the value of the purity of aluminum oxide described in the brochure can be referred to for the purity of aluminum oxide. In the case where the purity of aluminum oxide of the aluminum oxide particles is unknown, the purity of aluminum oxide can be measured in such a manner that the mass of the aluminum oxide particles is measured, then the aluminum oxide particles are calcined at 800° C. for 1 hour in an air atmosphere to remove organic material attached to the aluminum oxide particles and water adsorbed on the aluminum oxide particles, the mass of the aluminum oxide particles after calcining is measured, and the mass of the aluminum oxide particles after calcining is divided by the mass of the aluminum oxide particles before calcining. The purity of aluminum oxide can be calculated, for example, by the following equation (1).

$$\text{Purity (\% by mass) of aluminum oxide} = [(\text{Mass of aluminum oxide particles after calcining}) \div (\text{Mass of aluminum oxide particles before calcining})] \times 100 \quad (1)$$

The aluminum oxide particles preferably have an average particle diameter in a range of 0.1 μm or more and 1.5 μm or less, more preferably in a range of 0.2 μm or more and 1.2 μm or less, and further preferably in a range of 0.3 μm or more and 1.1 μm or less. In the case where the average particle diameter of the aluminum oxide particles is in the range, the nitride fluorescent material having a composition represented by the chemical formula (I) and the aluminum oxide particles can be uniformly mixed to form a green body, and the green body can be primary sintering to produce a ceramic composite material containing a sintered body having a high density with less voids. In the description herein, the average particle diameter of the aluminum oxide particles means an average particle diameter that is measured by the Fisher sub-sieve sizer (hereinafter referred to as "FSSS") method (i.e., the Fisher sub-sieve sizer's number).

The ratio of the aluminum oxide particles based on the total amount of 100% by mass of the fluorescent material and the aluminum oxide particles in the ceramic composite material is the balance except for the fluorescent material, and is preferably in a range of 30% by mass or more and 99.9% by mass or less. The mass ratio (% by mass) of aluminum oxide in the ceramic composite material is the same as the ratio (% by mass) of the aluminum oxide particles in the mixed powder obtained by mixing the fluorescent material and the aluminum oxide particles or in the green body formed by molding the mixed powder, assuming that the total amount of the fluorescent material and the aluminum oxide particles is 100% by mass.

The kind of aluminum oxide constituting the aluminum oxide particles is not particularly limited. Two or more kinds of aluminum oxide having different crystal structures may be used, and any of γ-aluminum oxide, δ-aluminum oxide, θ-aluminum oxide, and α-aluminum oxide may be used. The use of α-aluminum oxide is preferred due to the good availability, the easiness in mixing the fluorescent material and the aluminum oxide particles, and the easiness in forming the green body.

Rare Earth Aluminate Salt Fluorescent Material

The rare earth aluminate salt fluorescent material has a composition represented by the chemical formula (II).

$$(Ln^2{}_{1-a}Ce_a)_3(Al_cGa_b)_5O_{12} \qquad (II)$$

In the chemical formula (II), $Ln^2$ represents at least one element selected from the group consisting of Y, Gd, Lu, and Tb; and a, b, and c each satisfy $0<a\leq0.022$, $0\leq b\leq0.4$, $0<c\leq1.1$, and $0.9\leq b+c\leq1.1$. In the composition represented by the chemical formula (II), $Ln^2$ represents at least one element selected from the group consisting of Y, Gd, Lu, and Tb, and two or more kinds of the elements $Ln^2$ may be contained in the composition represented by the chemical formula (II). In the composition represented by the chemical formula (II), $Ln^2$ preferably represents at least one element selected from the group consisting of Y, Gd, and Lu.

In the composition represented by the chemical formula (II), Ce is an activating element and the product of 3 and the parameter a shows the molar ratio of Ce. In the chemical formula (II), the parameter a preferably satisfies more than 0 and 0.022 or less ($0<a\leq0.022$), more preferably in a range of 0.0001 or more and 0.020 or less ($0.0001\leq a\leq0.020$), further preferably in a range of 0.0002 or more and 0.015 or less ($0.0002\leq a\leq0.015$), still further preferably in a range of 0.0002 or more and 0.012 or less ($0.0002\leq a\leq0.012$), and particularly preferably in a range of 0.0003 or more and 0.012 or less ($0.0003\leq a\leq0.012$). In the chemical formula (II), in the case where the value of the value of parameter a as the activation amount of Ce is 0, no light emission occurs due to the absence of the element as the light emission center in the crystal structure. In the case where the parameter a exceeds 0.022, the concentration quenching occurs due to the too large amount of the activation element, resulting in a tendency of decrease of the light emission intensity.

In the chemical formula (II), the parameter b shows the amount of Ga contained in the rare earth aluminate salt fluorescent material instead of Al, and the product of the parameter b and 5 shows the molar ratio of Ga. In the chemical formula (II), for performing the wavelength conversion to the desired particle diameter and color tone, the value of parameter b may be in a range of 0.00001 or more and 0.35 or less ($0.001\times10^{-2}\leq b\leq0.35$), and may be in a range of 0.00005 or more and 0.30 or less ($0.005\times10^{-2}\leq b\leq0.30$).

In the chemical formula (II), the parameter c shows the amount of Al contained in the rare earth aluminate salt fluorescent material, and the product of the parameter c and 5 shows the molar ratio of Al. In the chemical formula (II), for the stability of the crystal structure, the parameter c preferably satisfies in a range of 0.5 or more and 1.1 or less ($0.5\leq c\leq1.1$), and more preferably in a range of 0.6 or more and 1.0 or less ($0.6\leq c\leq1.0$). The sum of the parameter b and the parameter c (b+c) is preferably in a range of 0.9 or more and 1.1 or less ($0.9\leq b+c\leq1.1$), and more preferably in a range of 0.95 or more and 1.10 or less ($0.95\leq b+c\leq1.10$).

The rare earth aluminate salt fluorescent material preferably has a median particle diameter in a range of 15 μm or more and 40 μm or less, more preferably in a range of 17 μm or more and 40 μm or less, further preferably in a range of 18 μm or more and 40 μm or less, still further preferably in a range of 19 μm or more and 35 μm or less, and particularly preferably in a range of 20 μm or more and 30 μm or less. In the case where the median particle diameter is in the range, light incident on the ceramic composite material that contains the rare earth aluminate salt fluorescent material can be efficiently subjected to the wavelength conversion, so as to increase the light emission intensity. Furthermore, the fluorescent material can be uniformly distributed in the ceramic composite material. The median particle diameter of the rare earth aluminate salt fluorescent material means a particle diameter where the volume cumulative frequency from the small diameter side measured by a laser diffractive scattering particle size distribution measuring method reaches 50% (median diameter). The ceramic composite material can contain the rare earth aluminate salt fluorescent material, for example, in such a manner that the surfaces of the aluminum oxide particles are fusion bonded to each other to form the base material with aluminum oxide, and the rare earth aluminate salt fluorescent material is contained in the base material of aluminum oxide in the state where the grain boundary thereof can be clearly confirmed.

In the step of preparing the green body, the total amount of the nitride fluorescent material having a composition represented by the chemical formula (I) and the rare earth aluminate salt fluorescent material having a composition represented by the chemical formula (II) is preferably in a range of 0.2% by mass or more and 80% by mass or less, more preferably in a range of 0.5% by mass or more and 75% by mass or less, further preferably in a range of 1.0% by mass or more and 70% by mass or less, and still further preferably in a range of 2% by mass or more and 70% by mass or less, based on 100% by mass of the green body. The nitride fluorescent material and the rare earth aluminate salt fluorescent material each are preferably in the form of powder. In the case where the ratio of the nitride fluorescent material and the rare earth aluminate salt fluorescent material is in a range of 0.2% by mass or more and 80% by mass or less based on 100% by mass of the green body, the ceramic composite material that has a high light emission intensity can be obtained, and the light emission intensity can be suppressed from being decreased even in the case of the use under an environment of high temperature, for example, of 150° C. or more, so as to provide a ceramic composite material that retains the high light emission intensity.

Method for Producing Ceramic Composite Material

FIG. 1 is a flow chart showing an example of the order of the process steps of the method for producing a ceramic composite material according to the first embodiment. The process steps of the method for producing a ceramic composite material will be described with reference to FIG. 1. The method for producing a ceramic composite material includes Step S102 of preparing a green body and Step S103 of a primary sintering. The method for producing a ceramic composite material may include Steps S101 of mixing powders before Step S102 of preparing a green body, and may include Step 104 of processing after Step S103 of the primary sintering.

Step of Mixing Powders

In the step of mixing powders, the powders of the nitride fluorescent material having a composition represented by the chemical formula (I), the aluminum oxide particles and depending on necessity the rare earth aluminate salt fluorescent material having a composition represented by the chemical formula (II) are mixed as the powder constituting a green body. The powder may be mixed with a mortar and a pestle. The powder may also be mixed with a mixing medium, such as a ball mill. A shaping auxiliary may be used to facilitate mixing of the powders and shaping of the mixed powder body. Example of the shaping auxiliary include water and ethanol. The shaping auxiliary is preferably evaporated easily in the subsequent steps of sintering. The shaping auxiliary may not be used. In the case where the shaping auxiliary is added, the amount of the shaping auxiliary is preferably 10 parts by mass or less, more preferably 8 parts by mass or less, further preferably 5 parts by mass or less, and preferably 0.1 parts by mass or more, per 100 parts by mass of the powder.

Step of Preparing Green Body

In the step of preparing a green body, the powder containing the nitride fluorescent material having a composition represented by the chemical formula (I), depending on necessity the rare earth aluminate salt fluorescent material having a composition represented by the chemical formula (II), and the aluminum oxide particles is molded into a desired shape to provide a green body. The molding method of the green body may be a known method, such as a press molding method, in which the powder is molded by pressing, and a slurry molding method, in which a slurry containing the powder is prepared, and the green body is obtained from the slurry. Examples of the press molding method include a die press molding method and a cold isostatic pressing (CIP) method (hereinafter referred to as a "CIP treatment"). Two kinds of the molding methods may be employed for arranging the shape of the green body, and it is possible that the die press molding is performed, and then the CIP treatment is performed. In the CIP treatment, the green body is preferably pressed with water as the medium.

The pressure in the die press molding is preferably from 5 MPa to 50 MPa, and more preferably from 5 MPa to 20 MPa. In the case where the pressure in the die press molding is in the range, the green body can be arranged to a desired shape.

The pressure in the CIP treatment is preferably from 50 MPa to 250 MPa, and more preferably from 100 MPa to 200 MPa. In the case where the pressure in the CIP treatment is in the range, the density of the green body can be increased, and the green body that has a substantially uniform density over the entire thereof can be obtained, thereby increasing the density of the sintered body obtained in the subsequent step of primary sintering and step of secondary sintering.

Step of Primary Sintering

In the step of primary sintering, the green body sintered at a temperature in a range of 1,250° C. or more and 1,600° C. or less, so as to provide a first sintered body. In the step of primary sintering, the sintered density of the nitride fluorescent material having a composition represented by the chemical formula (I), depending on necessity the rare earth aluminate salt fluorescent material having a composition represented by the chemical formula (II), and the aluminum oxide particles contained in the green body is increased, so as to provide the first sintered body that has a high relative density. Furthermore, in the case where the sintered density is increased in the step of primary sintering to provide the first sintered body having a high relative density, the relative density of the second sintered body can be further increased in the secondary sintering in the case where the secondary sintering is performed. In the case where the relative density of the first sintered body obtained through the step of primary sintering is as high as 80% or more, the second sintered body having a further higher relative density can be obtained in the step of secondary sintering described later. The ceramic composite material formed of the first sintered article obtained through the step of primary sintering emits light having a desired light emission peak wavelength through irradiation of excitation light, which is thus can be used as the ceramic composite material. While depending on the temperature of the primary sintering and the content of the nitride fluorescent material in the first sintered body, there are cases where the secondary sintering by the hot isostatic pressing process (which may be hereinafter referred to as an "HIP treatment") described later collapses the closed pores contained in the first sintered body, and decomposes and evaporates a part of the nitride fluorescent material contained in the first sintered body to form open pores in the second sintered body, and the density of the first sintered body may be higher than that of the second sintered body in some cases.

The temperature of the primary sintering is in a range of 1,250° C. or more and 1,600° C. or less. In the case where the temperature of the primary sintering is in the range, the surfaces of the aluminum oxide particles are fusion bonded, and the relative density of the first sintered body can be increased without the decomposition of the crystal structure of the nitride fluorescent material. In the case where the temperature of the primary sintering is less than 1,250° C., the surfaces of the aluminum oxide particles are not fused and the aluminum oxide particles are not fusion bonded due to the low sintering temperature, and thereby voids may be formed to fail to increase the relative density of the first sintered body. In the case where the temperature of the primary sintering exceeds 1,600° C., the nitride fluorescent material having a composition represented by the chemical formula (I) and the aluminum oxide particles are reacted with each other in the green body, so as to decompose the crystal structure of the nitride fluorescent material, and the resulting first sintered body does not emit light even under irradiation of excitation light. The temperature of the primary sintering is preferably in a range of 1,300° C. or more and 1,550° C. or less, more preferably in a range of 1,300° C. or more and 1,500° C. or less, and further preferably in a range of 1,350° C. or more and 1,450° C. or less, for increasing the relative density without the decomposition of the crystal structure of the nitride fluorescent material. The rare earth aluminate salt fluorescent material having a composition represented by the chemical formula (II) contained depending on necessity is not reacted with the aluminum oxide particles even in the case where the temperature of the primary sintering exceeds 1,600° C. The rare earth aluminate salt fluorescent material in the sintered body is contained in the base material of aluminum oxide, which is constituted by fusing the aluminum oxide particles and fusion bonding the aluminum oxide particles, in the state where the rare earth aluminate salt fluorescent material is distinguished from the aluminum oxide particles through the grain boundary thereof.

Examples of the method of the primary sintering include an atmospheric sintering method, in which the sintering is performed in a non-oxidative atmosphere without the application of pressure or load, a pressurized atmosphere sintering method, in which the sintering is performed in a non-oxidative atmosphere with application of pressure, a hot-press sintering method, and a spark plasma sintering (SPS) method.

The primary sintering is preferably performed in an atmosphere containing nitrogen gas. The atmosphere containing nitrogen gas may be an atmosphere that contains at least 99% by volume of nitrogen. The atmosphere containing nitrogen gas preferably contains nitrogen in an amount of 99% by volume or more, and more preferably 99.5% by volume or more. The atmosphere containing nitrogen gas may contain a slight amount of gas, such as oxygen, in addition to nitrogen, and the content of oxygen in the atmosphere containing nitrogen gas is preferably 1% by volume or less, more preferably 0.5% by volume or less, further preferably 0.1% by volume or less, still further preferably 0.01% by volume or less, and particularly preferably 0.001% by volume or less. In the case where the atmosphere of the primary sintering is the atmosphere containing nitrogen gas, deterioration of the crystal structure of the nitride fluorescent material having a composition represented by the chemical formula (I) can be suppressed in the primary sintering, and the first sintered body containing the nitride fluorescent material having the crystal structure thereof retained and depending on necessity the rare earth aluminate salt fluorescent material can be obtained.

The atmospheric pressure of the primary sintering is preferably in a range of 0.2 MPa or more and 2.0 MPa or less, and more preferably in a range of 0.8 MPa or more and 1.0 MPa or less, in terms of gauge pressure. While the nitride fluorescent material having a composition represented by the chemical formula (I) is liable to decompose at a higher temperature, the decomposition of the nitride fluorescent material can be suppressed by performing the primary sintering at an atmospheric pressure in the aforementioned range, thereby providing the first sintered body having a high light emission intensity.

The period of time of the primary sintering may be appropriately selected depending on the atmospheric pressure. The period of time of the heat treatment may be, for example, in a range of 0.5 hour or more and 20 hours or less, and is preferably in a range of 1 hour or more and 10 hours or less.

Figure 2:
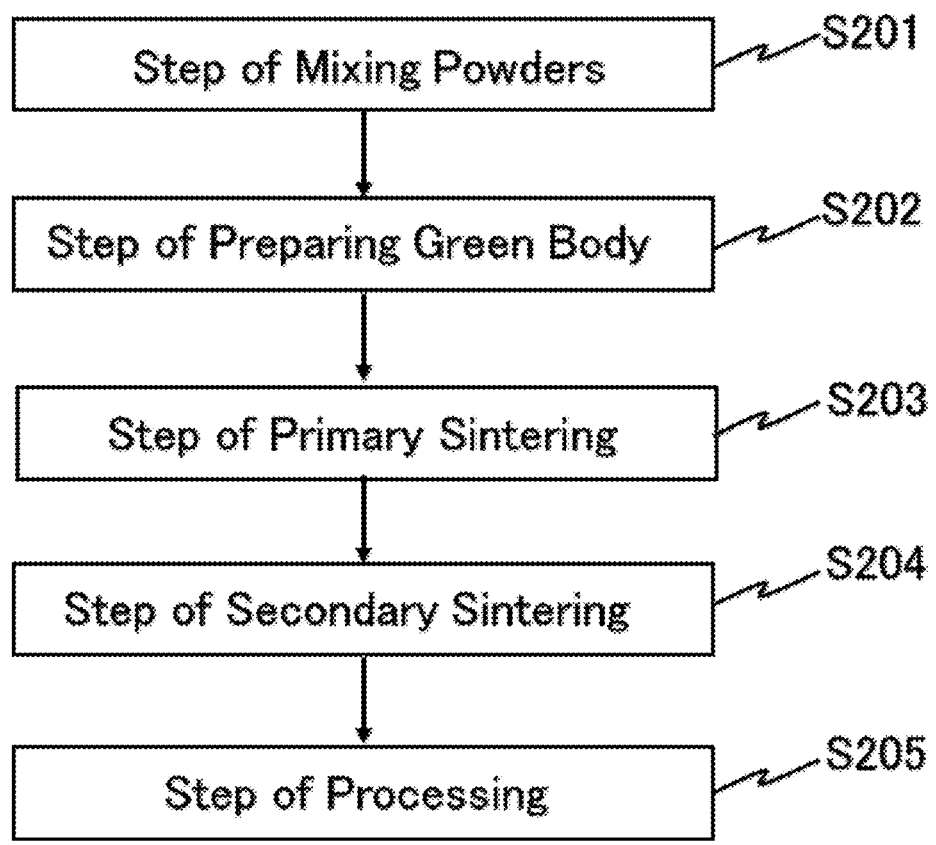
FIG. 2 is a flow chart showing a preferred example of the order of the process steps of the method for producing a ceramic composite material according to the first embodiment of the present disclosure.

FIG. 2 is a flow chart showing a preferred example of the order of the process steps of the method for producing a ceramic composite material according to the first embodiment. The preferred example of the order of the process steps of the method for producing a ceramic composite material according to the first embodiment includes Step S202 of preparing a green body and Step S203 of primary sintering, and preferably includes Step S204 of a secondary sintering. The preferred embodiment of the method for producing a ceramic composite material may include Step S201 of mixing powders before Step S202 of preparing the green body, and may include Step S205 processing of processing the ceramic composite material after Step S204 of the secondary sintering.

Step of Secondary Sintering

The step of secondary sintering is a step of secondary sintering the first sintered body by applying the hot isostatic pressing (HIP) treatment at a temperature in a range of 1,250° C. or more and 1,600° C. or less, so as to provide the second sintered body. In the secondary sintering step, the HIP treatment can decrease the voids contained in the first sintered body, so as to increase the density of the second sintered body. The second sintered body having a high density obtained through the HIP treatment has further higher transparency. The ceramic composite material formed of the second sintered body obtained through the step of secondary sintering has a further increased density of the sintered body, and emits light having a desired light emission peak wavelength through irradiation of excitation light, which is thus can be used as the ceramic composite material.

The temperature of the secondary sintering is preferably in a range of 1,250° C. or more and 1,600° C. or less. In the case where the temperature of the secondary sintering is in a range of 1,250° C. or more and 1,600° C. or less, the relative density of the first sintered body can be further increased without the decomposition of the crystal structure of the nitride fluorescent material. The temperature of the secondary sintering is more preferably in a range of 1,280° C. or more and 1,580° C. or less, further preferably in a range of 1,300° C. or more and 1,570° C. or less, still further preferably in a range of 1,320° C. or more and 1,550° C. or less, and still more further preferably in a range of 1,350° C. or more and 1,500° C. or less, and particularly preferably in a range of 1,350° C. or more and 1,450° C. or less.

The secondary sintering is preferably performed in an inert gas atmosphere. The inert gas atmosphere means an atmosphere that contains argon, helium, nitrogen as a major component in the atmosphere. The expression "argon, helium, nitrogen as a major component in the atmosphere" herein means that the atmosphere contains at least one kind of gas selected from the group consisting of argon, helium, and nitrogen in an amount of 50% by volume or more. The content of oxygen in the inert gas atmosphere is preferably 1% by volume or less, more preferably 0.5% by volume or less, further preferably 0.1% by volume or less, still further preferably 0.01% by volume or less, and particularly preferably 0.001% by volume or less. The inert gas atmosphere may be the same atmosphere as the atmosphere containing nitrogen gas in the primary sintering, and the content of nitrogen gas in the atmosphere containing nitrogen gas is preferably 99% by volume or more, and more preferably 99.5% by volume or more. In the case where the atmosphere of the secondary sintering is the inert gas atmosphere, the crystal structure of the nitride fluorescent material having a composition represented by the chemical formula (I) can be suppressed from being deteriorated in the secondary sintering, and the second sintered body containing the nitride fluorescent material having the crystal structure thereof retained and depending on necessity the rare earth aluminate salt fluorescent material having a composition represented by the chemical formula (II) can be obtained.

The pressure in the HIP treatment for performing the secondary sintering is preferably in a range of 50 MPa or more and 300 MPa or less, and more preferably in a range of 80 MPa or more and 200 MPa or less. In the case where the pressure in the HIP treatment is in the range, the sintered body can have a uniform and further higher density over the entire thereof without the deterioration of the crystal structure of the nitride fluorescent material having a composition represented by the chemical formula (I).

The period of time of the HIP treatment for the secondary sintering may be, for example, in a range of 0.5 hour or more and 20 hours or less, and is preferably in a range of 1 hour or more and 10 hours or less.

Step of Processing

The method for producing a ceramic composite material may include a step of processing the ceramic composite material formed of the resulting second sintered body. Examples of the processing step include a step of cutting the resulting ceramic composite material into a desired size. The cutting method for the ceramic composite material may be a known method, and examples thereof include blade dicing, laser dicing, and a wire saw. Among these, a wire saw is preferred since the cut surface becomes smooth with high accuracy. The ceramic composite material that has a desired thickness or size can be obtained through the processing step. The thickness of the ceramic composite material is not particularly limited, and is preferably in a range of 1 μm or more and 1 mm or less, more preferably in a range of 10 μm or more and 800 μm or less, further preferably in a range of 50 μm or more and 500 μm or less, and still further preferably in a range of 100 μm or more and 400 μm or less, in consideration of the mechanical strength and the wavelength conversion efficiency.

Relative Density of First Sintered Article

In the method for producing a ceramic composite material according to the first embodiment, the first sintered body obtained through the primary sintering step preferably has a relative density of 80% or more, more preferably 85% or more, further preferably 90% or more, still further preferably 91% or more, and particularly preferably 92% or more. The relative density of the first sintered body may be 100%, and the relative density of the first sintered body may be 99% or less or 98% or less. In the case where the relative density of the first sintered body is 80% or more, the density of the second sintered body can be increased in the secondary sintering after the primary sintering, and the voids of the resulting ceramic composite material can be decreased to suppress the scattering of light in the voids, thereby producing the ceramic composite material that has a high light emission intensity.

In the description herein, the relative density of the first sintered body is a value that is calculated from the apparent density of the first sintered body with respect to the true density of the first sintered body. The relative density can be calculated by the following equation (2).

Relative density (%) of first sintered body=[(Apparent density of first sintered body)÷(True density of first sintered body)]×100  (2)

The true density of the first sintered body is calculated from the mass ratio of the nitride fluorescent material having a composition represented by the chemical formula (I) (which may be hereinafter referred to as the "mass ratio (% by mass) of the nitride fluorescent material") in the first sintered body, the true density of the nitride fluorescent material, the mass ratio of the aluminum oxide particles (which may be hereinafter referred to as the "mass ratio (% by mass) of the aluminum oxide") in the first sintered body, and the true density of the aluminum oxide particles. The true density of the first sintered body can be calculated by the following equation (3-1).

$$\text{True density of first sintered body} = \frac{P_d \times A_d \times (P_m + A_m)}{(A_d \times P_m) + (P_d \times A_m)} \quad (3\text{-}1)$$

$P_m$: Mass ratio (% by mass) of nitride fluorescent material $P_d$: True density (g/cm$^3$) of nitride fluorescent material $A_m$: Mass ratio (% by mass) of aluminum oxide particles $A_d$: True density (g/cm$^3$) of aluminum oxide $P_m + A_m = 100\%$ by mass In the case where the first sintered body further contains the rare earth aluminate salt fluorescent material having a composition represented by the chemical formula (II), the true density of the first sintered body is calculated from the mass ratio (% by mass) of the nitride fluorescent material in the first sintered body, the true density of the nitride fluorescent material, the mass ratio (% by mass) of the aluminum oxide in the first sintered body, and the true density of the aluminum oxide particles optionally the mass ratio of the rare earth aluminate salt fluorescent material having a composition represented by the chemical formula (II) (hereinafter referred to as the "mass ratio (% by mass) of the rare earth aluminate salt fluorescent material") in the first sintered body, and the true density of the rare earth aluminate salt fluorescent material. The true density of the first sintered body can be calculated by the following equation (3-2).

$$\text{True density of first sintered body} = \frac{P1_d \times P2_d \times A_d \times (P1_m + P2_m + A_m)}{(P2_d \times A_d \times P1_m) + (P1_d \times A_d \times P2_m) + (P1_d \times P2_d \times A_m)} \quad (3\text{-}2)$$

$P1_m$: Mass ratio (% by mass) of nitride fluorescent material $P1_d$: True density (g/cm$^3$) of nitride fluorescent material $P2_m$: Mass ratio (% by mass) of rare earth aluminate fluorescent material $P2_d$: True density (g/cm$^3$) of rare earth aluminate fluorescent material $A_m$: Mass ratio (% by mass) of aluminum oxide particles $A_d$: True density (g/cm$^3$) of aluminum oxide $P1_m + P2_m + A_m = 100\%$ by mass The apparent density of the first sintered body is the value obtained by dividing the mass of the first sintered body by the volume of the first sintered body obtained by the Archimedes' method. The apparent density of the first sintered body can be calculated by the following equation (4).

Apparent density of first sintered body=[Mass (g) of first sintered body]÷[Volume(cm$^3$) of first sintered body(Archimedes method)]  (4)

Relative Density of Second Sintered Article

The second sintered body obtained after the secondary sintering preferably has a relative density of 90% or more, more preferably 91% or more, further preferably 92% or more, still further preferably 93% or more, and particularly preferably 95% or more. In the case where the relative density of the ceramic composite material formed of the second sintered body is 90% or more, the ceramic composite material may have less voids, and the light emission intensity can be increased. In the case where the relative density of the ceramic composite material formed of the second sintered body is 90% or more, the second sintered body may not be broken even when the second sintered body is processed, for example, in the step of processing, thereby providing the ceramic composite material formed of the processed second sintered body. The relative density of the second sintered body may be 100%, and the relative density of the second sintered body may be 99.9% or less or 99.8% or less.

In the description herein, the relative density of the second sintered body is a value that is calculated from the apparent density of the second sintered body with respect to the true density of the second sintered body. The ceramic composite material is formed of the second sintered body, and the relative density of the ceramic composite material may be the same as the relative density of the second sintered body. The relative density can be calculated by the following equation (5).

Relative density (%) of second sintered body=[(Apparent density of second sintered body)÷(True density of second sintered body)]×100  (5)

The true density of the second sintered body can be calculated by the same method as the true density of the first sintered body. The true density of the second sintered body is the same as the true density of the first sintered body.

The apparent density of the second sintered body is the value obtained by dividing the mass of the second sintered body by the volume of the second sintered body obtained by the Archimedes' method. The apparent density of the second sintered body can be calculated by the following equation (6).

Apparent density of second sintered body=[Mass (g) of second sintered body]÷[Volume(cm³) of second sintered body(Archimedes method)]   (6)

The resulting ceramic composite material formed of the first sintered body or the second sintered body can emit light having a desired light emission peak wavelength under irradiation of excitation light, and can be used as the ceramic composite material. The ceramic composite material formed of the first sintered body or the second sintered body having a relative density of 90% or more can have an increased relative light emission intensity and can have an increased light conversion efficiency.

Ceramic Composite Material

The ceramic composite material contains the nitride fluorescent material having a composition represented by the chemical formula (I), aluminum oxide, and depending on necessity the rare earth aluminate salt fluorescent material having a composition represented by the chemical formula (II), and has a content of the nitride fluorescent material having a composition represented by the chemical formula (I) in a range of 0.1% by mass or more and 70% by mass or less based on the total amount of the nitride fluorescent material and the aluminum oxide. In the case where the content of the nitride fluorescent material having a composition represented by the chemical formula (I) is in a range of 0.1% by mass or more and 70% by mass or less, the ceramic composite material can have an increased relative density and a high light emission intensity, and can perform wavelength conversion to a desired color tone. In the case where the content of the nitride fluorescent material having a composition represented by the chemical formula (I) in the ceramic composite material is less than 0.1% by mass, the desired conversion efficiency may not be obtained. In the case where the content of the nitride fluorescent material having a composition represented by the chemical formula (I) in the ceramic composite material exceeds 70% by mass, the content of the nitride fluorescent material per unit volume of the ceramic composite material becomes too large, and it is necessary to decrease the volume of the ceramic composite material for providing the desired color tone and the desired light conversion efficiency. For example, for decreasing the volume of the resulting ceramic composite material, the thickness of the ceramic composite material is necessarily decreased, which may complicate the handleability thereof. In the case where the content of the nitride fluorescent material having a composition represented by the chemical formula (I) exceeds 70% by mass, the amount of aluminum oxide in the ceramic composite material is relatively decreased, and the adhesiveness between the nitride fluorescent material and aluminum oxide may be decreased in the ceramic composite material, so as to form voids, resulting in the decrease of the light emission intensity in some cases. The content of the nitride fluorescent material having a composition represented by the chemical formula (I) in the ceramic composite material may be measured through elemental analysis of the elements constituting the nitride fluorescent material by the ICP (inductively coupled plasma) atomic emission spectroscopy.

The ceramic composite material preferably further contains the rare earth aluminate salt fluorescent material having a composition represented by the chemical formula (II), and the total content of the nitride fluorescent material and the rare earth aluminate salt fluorescent material is preferably in a range of 0.2% by mass or more and 80% by mass or less, more preferably in a range of 0.5% by mass or more and 75% by mass or less, further preferably in a range of 1.0% by mass or more and 70% by mass or less, and still further preferably in a range of 2% by mass or more and 70% by mass or less based on 100% by mass of the ceramic composite material. In the case where the total content of the nitride fluorescent material and the rare earth aluminate salt fluorescent material in the ceramic composite material is in a range of 0.2% by mass or more and 80% by mass or less, the light emission intensity can be suppressed from being decreased, so as to retain the high light emission intensity even in the case of the use under an environment of high temperature, for example, of 150° C. or more.

The ceramic composite material preferably contains the nitride fluorescent material in an amount of 15% by mass or more, more preferably 20% by mass or more, and further preferably 25% by mass or more, and may contain the nitride fluorescent material in an amount of 100% by mass or 99% by mass or less, based on the total amount of 100% by mass of the nitride fluorescent material and the rare earth aluminate salt fluorescent material. In the case where the ceramic composite material contains the nitride fluorescent material in an amount of 15% by mass or more based on the total amount of 100% by mass of the nitride fluorescent material and the rare earth aluminate salt fluorescent material, the light emission intensity can be suppressed from being decreased, so as to retain the high light emission intensity even in the case of the use under an environment of high temperature, for example, of 150° C. or more. It has been known that the rare earth aluminate salt fluorescent material is significantly decreased in light emission intensity at a high temperature, for example, of 150° C. or more while the mechanism therefor has not been clear. The ceramic composite material contains the nitride fluorescent material in an amount of 15% by mass or more based on the total amount of 100% by mass of the nitride fluorescent material and the rare earth aluminate salt fluorescent material, along with the rare earth aluminate salt fluorescent material, or instead of the rare earth aluminate salt fluorescent material, and thereby the light emission intensity can be suppressed from being decreased, so as to retain the high light emission intensity even in the case of the use under an environment of high temperature of 150° C. or more. The environment of high temperature, under which the ceramic composite material used, for example, may be 150° C. or more, may be 200° C. or more, may be 220° C. or more, may be 400° C. or less, and may be 340° C. or less.

The nitride fluorescent material having a composition represented by the chemical formula (I) in the ceramic composite material is distinguished through the grain boundary of aluminum oxide in the ceramic composite material. The base material of the ceramic composite material is constituted in such a manner that the surfaces of the aluminum oxide particles as the raw material of aluminum oxide constituting the base material of the ceramic composite material are fusion bonded to each other while retaining the grain boundary of the aluminum oxide particles, so as to constitute the base material of the ceramic composite material. The ceramic composite material contains the base material of the aluminum oxide particles, and therein the nitride fluorescent material having a composition represented by the chemical formula (I) having the different crystal structure from the crystal structure of aluminum oxide, and depending on necessity the rare earth aluminate salt fluorescent material having a composition represented by the chemical formula (II), and the ceramic composite material is constituted by aluminum oxide and the nitride fluorescent material integrated with each other, or by aluminum oxide, the nitride fluorescent material, and the rare earth aluminate salt fluorescent material integrated with each other.

The ceramic composite material according to the second embodiment of the present disclosure is preferably a ceramic composite material that is formed of the first sintered body obtained by the production method according to the first embodiment of the present disclosure, or a ceramic composite material that is formed of the second sintered body obtained thereby. The ceramic composite material that is formed of the first sintered body obtained by the production method according to the first embodiment of the present disclosure or the ceramic composite material that is formed of the second sintered body obtained thereby preferably has a relative density of 80% or more. In the case where the relative density of the ceramic composite material is 80% or more, a high light emission intensity can be obtained. In the case where the relative density of the ceramic composite material is 80% or more, furthermore, the ceramic composite material may not be cracked or broken even in the case where the ceramic composite material is subjected to processing, such as cutting, and thereby the ceramic composite material that is applied to a light emitting device can be suppressed in occurrence of color unevenness. The relative density of the ceramic composite material is more preferably 85% or more, further preferably 90% or more, still further preferably 91% or more, and particularly preferably 92% or more. The relative density of the ceramic composite material may be 100% and may be 99.9% or less or 99.8% or less.

Light Emitting Device

The ceramic composite material obtained by the production method according to the first embodiment or the ceramic composite material according to the second embodiment may be combined with a light emitting element, such as LED and LD, and thereby can emit light having a desired light emission peak wavelength through the conversion of the excitation light emitted from the light emitting element. The light emitting device can emit mixed light of the light emitted from the light emitting element and the light after the wavelength conversion by the ceramic composite material.

The light emitting device according to the third embodiment of the present disclosure preferably includes the ceramic composite material obtained by the production method according to the first embodiment or the ceramic composite material according to the second embodiment and a light emitting element having a light emission peak wavelength in a range of 350 nm or more and 500 nm or less. The light emitting element used may be, for example, a semiconductor light emitting element using a nitride semiconductor ($In_XAl_YGa_{1-X-Y}N$, wherein $0 \leq X$, $0 \leq Y$, and $X+Y \leq 1$). The use of a semiconductor light emitting element as the excitation light source can provide a stable light emitting device that has a high efficiency, a high linearity of the output with respect to the input, and a high strength against mechanical impacts.

EXAMPLES

The present invention will be described more specifically with reference to examples below. The present invention is not limited to the examples.

Example 1

Step of Mixing Powders 1 part by mass (1% by mass based on 100% by mass of the mixed powder or a green body) of a nitride fluorescent material having a composition represented by $Ce_{0.15}La_{2.75}Si_6N_{11}$ having a median particle diameter of 20.0 μm measured by the laser diffractive scattering particle size distribution measuring method and 99 parts by mass of α-aluminum oxide particles having an average particle diameter of 1.0 μm measured by the FSSS method (product name: AKP-700, manufactured by Sumitomo Chemical Co., Ltd., purity of aluminum oxide: 99.5% by mass) were weighed and mixed with a mortar and a pestle, so as to prepare mixed powder for a green body.

Step of Preparing Green Body

The mixed powder was charged in a die and press-molded to a green body having a cylindrical shape having a diameter of 28.5 mm and a thickness of 10 mm under a pressure of 7 MPa (71.38 kgf/cm$^2$). The resulting green body was placed in a packaging container and vacuum packed, and subjected to a cold isostatic pressing (CIP) treatment at 176 MPa with water as the pressure medium using a CIP equipment (manufactured by Kobe Steel, Ltd.).

Step of Primary Sintering

The resulting green body was primary sintered by retaining to 1,350° C. and 0.9 MPa for 6 hours in a nitrogen gas atmosphere (nitrogen: 99% by volume or more) with a sintering furnace (manufactured by Fujidempa Kogyo Co., Ltd.), so as to provide a first sintered body. The resulting first sintered body 1 was designated as a ceramic composite material. In the ceramic composite materials formed of the first sintered bodies and the second sintered bodies of Examples 1 to 14, the content (% by mass) of the nitride fluorescent material is substantially equal to the mass ratio of the nitride fluorescent material in the mixed powder or the green body.

Example 2

A first sintered body 2 was obtained in the same manner as in Example 1 except that mixed powder obtained by mixing 3 parts by mass of the nitride fluorescent material and 97 parts by mass of the α-aluminum oxide particles was prepared, and was designated as a ceramic composite material. In Examples 2 to 14, the nitride fluorescent material used was the same nitride fluorescent material represented by $Ce_{0.15}La_{2.75}Si_6N_{11}$ as in Example 1. In Examples 2 to 14, the aluminum oxide particles used were the same α-aluminum oxide particles as in Example 1. The contents (% by mass) of the nitride fluorescent material represented by $Ce_{0.15}La_{2.75}Si_6N_{11}$ in the ceramic composite materials formed of the first sintered bodies in Examples 1 to 11 are shown in Table 1. The contents (% by mass) of the nitride fluorescent material represented by $Ce_{0.15}La_{2.75}Si_6N_{11}$ in the ceramic composite materials formed of the second sintered bodies in Examples 12 to 14 are shown in Table 2.

Example 3

A first sintered body 3 was obtained in the same manner as in Example 1 except that mixed powder obtained by

Example 4

A first sintered body 4 was obtained in the same manner as in Example 1 except that mixed powder obtained by mixing 10 parts by mass of the nitride fluorescent material and 90 parts by mass of the α-aluminum oxide particles was prepared, and was designated as a ceramic composite material.

Example 5

A first sintered body 6 was obtained in the same manner as in Example 1 except that mixed powder obtained by mixing 20 parts by mass of the nitride fluorescent material and 80 parts by mass of the α-aluminum oxide particles was prepared, and was designated as a ceramic composite material.

Example 6

A first sintered body 6 was obtained in the same manner as in Example 1 except that mixed powder obtained by mixing 30 parts by mass of the nitride fluorescent material and 70 parts by mass of the α-aluminum oxide particles was prepared, and was designated as a ceramic composite material.

Example 7

A first sintered body 7 was obtained in the same manner as in Example 1 except that mixed powder obtained by mixing 50 parts by mass of the nitride fluorescent material and 50 parts by mass of the α-aluminum oxide particles was prepared, and was designated as a ceramic composite material.

Example 8

A first sintered body 8 was obtained in the same manner as in Example 1 except that mixed powder obtained by mixing 5 parts by mass of the nitride fluorescent material and 95 parts by mass of the α-aluminum oxide particles was prepared, and the primary firing temperature was changed to 1,250° C., and was designated as a ceramic composite material.

Example 9

A first sintered body 9 was obtained in the same manner as in Example 1 except that mixed powder obtained by mixing 5 parts by mass of the nitride fluorescent material and 95 parts by mass of the α-aluminum oxide particles was prepared, and the primary firing temperature was changed to 1,300° C., and was designated as a ceramic composite material.

Example 10

A first sintered body 10 was obtained in the same manner as in Example 1 except that mixed powder obtained by mixing 5 parts by mass of the nitride fluorescent material and 95 parts by mass of the α-aluminum oxide particles was prepared, and the primary firing temperature was changed to 1,400° C., and was designated as a ceramic composite material.

Example 11

A first sintered body 11 was obtained in the same manner as in Example 1 except that mixed powder obtained by mixing 5 parts by mass of the nitride fluorescent material and 95 parts by mass of the α-aluminum oxide particles was prepared, and the primary sintering temperature was changed to 1,450° C., and was designated as a ceramic composite material.

Example 12

Step of Secondary Sintering

The first sintered body 3 obtained in Example 3 was secondary sintered by a hot isostatic pressing (HIP) treatment at 1,400° C. and 195 MPa for 1 hour in a nitrogen gas atmosphere (nitrogen: 99% by volume or more) with nitrogen gas as the pressure medium using a HIP equipment (manufactured by Kobe Steel, Ltd.), so as to provide a second sintered body 12, and the second sintered body 12 was designated as a ceramic composite material.

Example 13

Step of Secondary Sintering

The first sintered body 10 obtained in Example 10 was subjected to a HIP treatment in the same manner as in Example 12, so as to provide a second sintered body 13, and the second sintered body 13 was designated as a ceramic composite material.

Example 14

Step of Secondary Sintering

The first sintered body 10 obtained in Example 10 was secondary sintered by a HIP treatment at 1,500° C. and 195 MPa for 1 hour in a nitrogen gas atmosphere (nitrogen: 99% by volume or more) with nitrogen gas as the pressure medium so as to provide a second sintered body 14, and the second sintered body 14 was designated as a ceramic composite material.

Comparative Example 1

Step of Mixing Powders 5 parts by mass of the same nitride fluorescent material as in Example 1 and 95 parts by mass of calcium fluoride ($CaF_2$) particles (manufactured by Nichia Corporation, calcium fluoride purity: 99.5% by mass, average particle diameter by FSSS method: 9.0 μm) were mixed to provide mixed powder.

Step of Preparing Green Body

The mixed powder was charged in a die and press-molded to a green body having a cylindrical shape having a diameter of 28.5 mm and a thickness of 10 mm under a pressure of 7 MPa (71.38 kgf/cm$^2$). The resulting green body was placed in a packaging container and vacuum packed, and subjected to a cold isostatic pressing (CIP) treatment at 176 MPa with water as the pressure medium using a CIP equipment (manufactured by Kobe Steel, Ltd.).

Step of Primary Sintering

The resulting green body was primary sintered by retaining to 1,200° C. and 0.9 MPa for 6 hours in a nitrogen gas atmosphere (nitrogen: 99% by volume or more) with a sintering furnace (manufactured by Fujidempa Kogyo Co., Ltd.), so as to provide a first sintered body, which had a relative density of 81.6%. No light emission was observed from the first sintered body. The first sintered body was not subjected to a HIP treatment since no light emission was confirmed, and the relative density thereof was as small as 81.6%. This is because in the case where the relative density of the first sintered body is less than 90%, the first sintered body contains a large amount of voids, and the relative density of the second sintered body obtained by performing the secondary sintering by a HIP treatment cannot be increased to 90% or more.

Comparative Example 2

A first sintered body was obtained in the same manner as in Comparative Example 1 except that mixed powder obtained by mixing 5 parts by mass of the same nitride fluorescent material as in Example 1 and 95 parts by mass of magnesium fluoride ($MgF_2$) particles (manufactured by Nichia Corporation, magnesium fluoride purity: 99.5% by mass, average particle diameter by FSSS method: 1.5 μm) was prepared. The resulting first sintered body had a relative density of 88.1%. No light emission was observed from the first sintered body. The first sintered body was not subjected to a HIP treatment since no light emission was confirmed, and the relative density thereof was as small as 88.1%.

Comparative Example 3

A first sintered body was obtained in the same manner as in Comparative Example 1 except that mixed powder obtained by mixing 5 parts by mass of the same nitride fluorescent material as in Example 1 and 95 parts by mass of titanium oxide particles (manufactured by Showa Denko K.K., titanium oxide purity: 99.0% by mass, average particle diameter by FSSS method: 0.6 μm) was prepared. The resulting first sintered body had a relative density of 79.1%. No light emission was observed from the first sintered body. The first sintered body was not subjected to a HIP treatment since no light emission was confirmed, and the relative density thereof was as small as 79.1%.

Comparative Example 4

A first sintered body was obtained in the same manner as in Comparative Example 1 except that mixed powder obtained by mixing 5 parts by mass of the same nitride fluorescent material as in Example 1 and 95 parts by mass of zirconium oxide particles (manufactured by Nippon Denko Co., Ltd., zirconium oxide purity: 99.6% by mass, average particle diameter by FSSS method: 0.3 μm) was prepared. The resulting first sintered body had a relative density of 52.5%. No light emission was observed from the first sintered body. The first sintered body was not subjected to a HIP treatment since no light emission was confirmed, and the relative density thereof was as small as 52.5%.

Measurement of Median Particle Diameter by Laser Diffractive Scattering Particle Size Distribution Measuring Method For the particles of the nitride fluorescent material having a composition represented by $Ce_{0.15}La_{2.75}Si_6N_{11}$ and the particles of the rare earth aluminate salt fluorescent material having a composition represented by $(Y_{0.995}Ce_{0.005})_3Al_5O_{12}$, which were used in Examples and Comparative Examples, a particle diameter where the volume cumulative frequency from the small diameter side in the particle size distribution on volume basis by a laser diffractive scattering particle size distribution measuring method reached 50% (median diameter) was designates as the median particle diameter. The measurement was performed with a laser diffractive scattering size distribution measuring equipment (Master Sizer 3000, manufactured by Malvern Instruments Ltd.).

Measurement of Average Particle Diameter by FSSS Method

For the α-aluminum oxide particles used in Examples and the calcium fluoride particles, the magnesium fluoride particles, the titanium oxide particles, and the zirconium oxide particles used in Comparative Examples, the average particle diameter (Fisher sub-sieve sizer's number) was measured by the FSSS method using a Fisher Sub-Sieve Sizer Model 95 (manufactured by Fisher Scientific Inc.).

Measurement of Purity of α-Aluminum Oxide

The purity of the α-aluminum oxide particles used in Examples was measured in such a manner that the mass of the α-aluminum oxide particles was measured, then the α-aluminum oxide particles were fired at 800° C. for 1 hour in an air atmosphere to remove organic material attached to the α-aluminum oxide particles and water adsorbed on the aluminum oxide particles, the mass of the α-aluminum oxide particles after firing was measured, and the mass of the α-aluminum oxide particles after firing was divided by the mass of the α-aluminum oxide particles before firing according to the equation (1).

Measurement of Relative Density of First Sintered Body

In Examples 1 to 14 and Comparative Examples 1 to 4, the relative density of the first sintered body was measured. The results of Examples 1 to 14 are shown in Tables 1 and 2, and the results of Comparative Examples 1 to 4 are shown in Table 3. The relative density of the first sintered body was calculated according to the equation (2), the equation (3-1), and the equation (4). The calculation was performed on the assumption that the true density of the nitride fluorescent material represented by $Ce_{0.15}La_{2.75}Si_6N_{11}$ used in Examples 1 to 14 and Comparative Examples 1 to 4 was 4.78 $g/cm^3$, the true density of the α-aluminum oxide particles used in Examples 1 to 14 was 3.98 $g/cm^3$, the true density of the calcium fluoride particles used in Comparative Example 1 was 3.17 $g/cm^3$, the true density of the magnesium fluoride particles used in Comparative Example 2 was 3.17 $g/cm^3$, the true density of the titanium oxide particles used in Comparative Example 3 was 4.26 $g/cm^3$, and the true density of the zirconium oxide particles used in Comparative Example 4 was 5.86 $g/cm^3$. The relative density of the first sintered article in Comparative Examples 1 to 4 was calculated according to the equation (3-1), in which the aluminum oxide particles were replaced by the calcium fluoride particles, the magnesium fluoride particles, the titanium oxide particles, and the zirconium oxide particles, respectively.

Measurement of Relative Density of Second Sintered Body

The relative density was measured for the second sintered bodies 12 to 14 in Examples 12 to 14. The results are shown in Table 2. The relative density of the second sintered body was calculated according to the equation (5). The apparent relative density of the second sintered body was calculated according to the equation (6).

Measurement of Relative Light Emission Intensity

The ceramic composite materials formed of the first sintered bodies of Examples 1 to 11, the ceramic composite materials formed of the second sintered bodies of Examples 12 to 14, and the first sintered bodies of Comparative Examples 1 to 4 each were cut into a thickness of 300 μm with a wire saw, so as to provide a specimen. An LED chip formed of a nitride semiconductor having a light emission peak wavelength of 455 nm was used as a light source, and the specimen of the ceramic composite material was irradiated with light from the light source. The light emission intensity of light at a light emission peak wavelength in a wavelength range of 430 nm or more and 800 nm or less obtained from each of the specimens of Examples 1 to 11, Examples 12 to 14, and Comparative Examples 1 to 4 under irradiation of light from the light source was measured with a spectrofluorophotometer (manufactured by Nichia Corporation). Assuming that the light emission intensity of light at a light emission peak wavelength in a wavelength range of 430 nm or more and 800 nm or less obtained from the specimen of the ceramic composite material of Example 3 was 100%, the light emission intensity of light at a light emission peak wavelength in a wavelength range of 430 nm or more and 800 nm or less obtained from each of the specimens was expressed in terms of relative light emission intensity (%). The results of the ceramic composite materials of Examples 1 to 11 are shown in Table 1. The results of the ceramic composite materials of Examples 12 to 14 are shown in Table 2. The specimens formed of the first sintered bodies of Comparative Examples 1 to 4 did not emit light even under irradiation with light from the light source. The results of the first sintered bodies of Comparative Examples 1 to 4 are shown in Table 3.

appearance of a specimen obtained by cutting the ceramic composite material of Example 13 with a wire saw.

Figure 5:
FIG. 5 is a photograph of appearance of the ceramic composite material of Comparative Example 4.

A photograph of appearance of the ceramic composite material of Comparative Example 4 was obtained. FIG. 5 is the photograph of appearance of a specimen obtained by cutting the first sintered body of Comparative Example 4 with a wire saw.

TABLE 1

| | | | First sintered body | | |
|---|---|---|---|---|---|
| | Content of nitride fluorescent material (% by mass) | Primary sintering temperature (° C.) | No. | Relative density (%) | Relative light emission intensity (%) |
| Example 1 | 1 | 1350 | 1 | 96.7 | 69.3 |
| Example 2 | 3 | 1350 | 2 | 93.3 | 80.5 |
| Example 3 | 5 | 1350 | 3 | 92.8 | 100.0 |
| Example 4 | 10 | 1350 | 4 | 92.5 | 105.0 |
| Example 5 | 20 | 1350 | 5 | 91.7 | 149.1 |
| Example 6 | 30 | 1350 | 6 | 89.0 | 142.4 |
| Example 7 | 50 | 1350 | 7 | 75.3 | 73.6 |
| Example 8 | 5 | 1250 | 8 | 86.2 | 61.0 |
| Example 9 | 5 | 1300 | 9 | 89.6 | 69.3 |
| Example 10 | 5 | 1400 | 10 | 96.1 | 205.0 |
| Example 11 | 5 | 1450 | 11 | 96.4 | 129.1 |

TABLE 2

| | Content of nitride fluorescent material (% by mass) | First sintered body | | | Second sintered body | | |
|---|---|---|---|---|---|---|---|
| | | Primary sintering temperature (° C.) | No. | Relative density (%) | Relative light emission intensity (%) | Secondary sintering temperature (° C.) | No. | Relative density (%) | Relative light emission intensity (%) |
| Example 12 | 5 | 1350 | 3 | 92.8 | 100.0 | 1400 | 12 | 94.2 | 115.2 |
| Example 13 | 5 | 1400 | 10 | 96.1 | 205.0 | 1400 | 13 | 99.0 | 227.6 |
| Example 14 | 5 | 1400 | 10 | 96.1 | 205.0 | 1500 | 14 | 99.3 | 159.4 |

TABLE 3

| | Content of nitride fluorescent material (% by mass) | Inorganic particles | Primary sintering temperature (° C.) | First sintered body | |
|---|---|---|---|---|---|
| | | | | Relative density (%) | Relative light emission intensity (%) |
| Comparative Example 1 | 5 | $CaF_2$ | 1200 | 81.6 | No light emission |
| Comparative Example 2 | 5 | $MgF_2$ | 1200 | 88.1 | No light emission |
| Comparative Example 3 | 5 | $TiO_2$ | 1200 | 79.1 | No light emission |
| Comparative Example 4 | 5 | $ZrO_2$ | 1200 | 52.5 | No light emission |

Photograph of Appearance

Figure 3:
FIG. 3 is a photograph of appearance of the ceramic composite material of Example 3.

A photograph of appearance of the ceramic composite material of Example 3 was obtained. FIG. 3 is the photograph of appearance of a specimen obtained by cutting the ceramic composite material of Example 3 with a wire saw.

Figure 4:
FIG. 4 is a photograph of appearance of the ceramic composite material of Example 13.

A photograph of appearance of the ceramic composite material of Example 13 was obtained. The ceramic composite material of Example 13 was formed of the second sintered body obtained by secondary sintering the first sintered body of Example 3. FIG. 4 is the photograph of The ceramic composite materials 2 formed of the first sintered bodies 1 to 11 of Examples 1 to 11 and the ceramic composite materials formed of the second sintered bodies 12 to 14 of Examples 12 to 14 emitted light having a light emission peak wavelength in a wavelength range of 430 nm or more and 800 nm or less under irradiation of the excitation light having a light emission peak wavelength of 455 nm from the light source, and were able to be used as the ceramic composite material.

As shown in Table 1, Examples 1 to 7 were examples where the content of the nitride fluorescent material represented by $Ce_{0.15}La_{2.75}Si_6N_{11}$ was changed from 1% by mass to 50% by mass at a temperature of the primary sintering of 1,350° C., so as to provide the first sintered bodies 1 to 7, which were designated as the ceramic composite materials. As shown in Table 1, the first sintered bodies 1 to 5 of Examples 1 to 5 had a high relative density of 90% or more. The first sintered bodies 1 and 2 of Examples 1 and 2 had a relative density of 90% or more due to the large content of aluminum oxide, but had a relative light emission intensity that was lower than Example 3 due to the small content of the nitride fluorescent material. The first sintered bodies 3 to 5 of Examples 3 to 5 had a relative density of 90% or more and a high relative light emission intensity of 100% or more. The first sintered body 6 of Example 6 had a relative density of 90% or less due to the smaller amount of aluminum oxide than the first sintered body 3 of Example 3, but retained the high relative light emission intensity. The first sintered body 7 of Example 7 had a relative density of 80% or less due to the smaller amount of aluminum oxide than the first sintered body 6 of Example 6, and also had a decreased relative light emission intensity.

As shown in Table 1, the ceramic composite materials of Examples 8 to 11 were examples where the temperature of the primary sintering was changed in a range of 1,250° C. or more and 1,450° C. or less with a content of the nitride fluorescent material represented by $Ce_{0.15}La_{2.75}Si_6N_{11}$ of 5% by mass, so as to provide the first sintered bodies 8 to 11, which were designated as the ceramic composite materials. As shown in Table 1, for the ceramic composite material of Example 8, the temperature of the primary sintering was as low as 1,250° C., and the relative density of the first sintered body 8 was as low as 86.2%, from which it was estimated that the first sintered body 8 contained voids therein. For this reason, the ceramic composite material of Example 8 had a low relative light emission intensity of 61.0%. As shown in Table 1, for the ceramic composite material of Example 9, the temperature of the primary sintering was 1,300° C., and the relative density of the first sintered body 9 was 89.6%, which was lower than 90%, from which it was estimated that the first sintered body 9 contained a certain amount of voids therein, resulting in a low relative light emission intensity of 69.3%. As shown in Table 1, for the ceramic composite material of Example 10, the temperature of the primary sintering was 1,400° C., and the relative density of the first sintered body 10 was as high as 96.1%, which meant that voids were suppressed to achieve densification, by which the relative light emission intensity was as high as 205.0%. For the ceramic composite material of Example 11, the temperature of the primary sintering was as high as 1,450° C., and thus the relative density of the first sintered body 11 was as high as 96.4%. On the other hand, the ceramic composite material of Example 11 had a relative light emission intensity of 129.1%, which was lower than the first sintered body 10, from which it was estimated that nitrogen in the nitride fluorescent material and oxygen in aluminum oxide were reacted with each other due to the high temperature of the primary sintering, and a part of the crystal structure of the nitride fluorescent material was decomposed.

As shown in Table 2, the ceramic composite materials of Examples 12 to 14 were formed of the second sintered bodies 12 to 14 obtained by secondary sintering the first sintered body 3 or 10 by the HIP treatment at 1,400° C. or 1,500° C. The ceramic composite materials were densified through the secondary sintering by the HIP treatment, and in particular, the ceramic composite material of Example 13 had a relative light emission intensity that was higher than the ceramic composite material of Example 3 by 225% or more.

As shown in Table 2, in Examples 12 to 14, the second sintered bodies 12 to 14 had a higher relative density than the first sintered body 3 or 10.

As shown in Table 2, for the ceramic composite material of Example 12, the resulting first sintered body 3 had a relative density of 95% or less due to the low temperature of the primary sintering of 1,350° C., and even though the secondary sintering was performed by the HIP treatment at 1,400° C., the relative density of the resulting second sintered body 12 was 94.2%. It was estimated therefrom that for the ceramic composite material of Example 12, in the case where temperature for providing the first sintered body 3 was low, the second sintered body 12 contained a large amount of voids even though the secondary sintering was performed by the HIP treatment, and it was considered that the relative light emission intensity was not increased as in the ceramic composite material of Example 13.

As shown in Table 2, the ceramic composite material of Example 14 had a higher relative density than the first sintered body 10, but the relative light emission intensity thereof was lower than the first sintered body 10. It was estimated that for the ceramic composite material of Example 14, the nitride fluorescent material and the aluminum oxide particles as an oxide were reacted with each other in the stage of the secondary sintering at 1,500° C. by the HIP treatment, so as to decompose the crystal structure of the nitride fluorescent material slightly, and thereby the relative light emission intensity thereof was not increased even though the secondary sintering was performed.

As shown in Table 3, the first sintered bodies of Comparative Examples 1 to 4 obtained by primary sintering the nitride fluorescent material along with the inorganic fluoride particles or the inorganic oxide particles other than the aluminum oxide particles each had a relative density of 90.0% or less, and did not emit light under irradiation of the excitation light. It was estimated from the results of Comparative Examples 1 to 4 that the inorganic compound particles other than the aluminum oxide particles and the nitride fluorescent material having a composition represented by the chemical formula (I) were reacted with each other at 1,200° C., and a part or the whole of the crystal structure of the nitride fluorescent material was decomposed.

The appearance of the ceramic composite material of Example 3 overall exhibited yellow color and retained the inherent color of the nitride fluorescent material represented by $Ce_{0.15}La_{2.75}Si_6N_{11}$. As shown in FIG. 3, the appearance of the ceramic composite material of Example 3 did not have color unevenness observed, and had an overall uniform color, from which it was confirmed that the nitride fluorescent material contained in the ceramic composite material was not deteriorated by the primary sintering. In FIGS. 3 to 5, a blackish portion found at the edge of the ceramic composite material was a residue of the mark for the production of the specimen by cutting the ceramic composite material with a wire saw, and was not derived from the nitride fluorescent material.

The appearance of the ceramic composite material of Example 13 overall exhibited bright color, which was deeper yellow than Example 3, and retained the inherent color of the nitride fluorescent material. It is considered that the reason why the appearance of the ceramic composite material of Example 13 seemed to be brighter and deeper yellow than the ceramic composite material of Example 3 was that the densification of the second sintered body 11 obtained by the secondary sintering by the HIP treatment proceeded to increase the transparency. As shown in FIG. 4, the appearance of the ceramic composite material of Example 13 had no color unevenness observed but overall had a uniform color, from which it was confirmed that the nitride fluorescent material was not deteriorated by the primary sintering and the secondary sintering by the HIP treatment.

The appearance of the first sintered body of Comparative Example 4 overall exhibited a whitish color as shown in FIG. 5, and did not retain the yellow color, which was the inherent color of the nitride fluorescent material. It was estimated that the reason why the first sintered body of Comparative Example 4 overall exhibited a whitish color, and did not retain the yellow color, which was the inherent color of the nitride fluorescent material was the low transparency caused by the insufficient densification.

Example 15

Step of Mixing Powders 1 part by mass (1% by mass based on 100% by mass of the mixed powder or the green body) of a nitride fluorescent material having a composition represented by $Ce_{0.15}La_{2.75}Si_6N_{11}$ having a median particle diameter of 20.0 μm measured by the laser diffractive scattering particle size distribution measuring method, 19 parts by mass (19% by mass based on 100% by mass of the mixed powder or the green body) of a rare earth aluminate salt fluorescent material having a composition represented by $(Y_{0.995}Ce_{0.005})_3Al_5O_{12}$ having a median particle diameter of 25.0 μm measured by the laser diffractive scattering particle size distribution measuring method, and 80 parts by mass (80% by mass based on 100% by mass of the mixed powder or the green body) of α-aluminum oxide particles having an average particle diameter of 1.0 μm measured by the FSSS method (product name: AKP-700, manufactured by Sumitomo Chemical Co., Ltd., purity of aluminum oxide: 99.5% by mass) were weighed and mixed with a mortar and a pestle, so as to prepare mixed powder for a green body.

Step of Preparing Green Body

The mixed powder was charged in a die and press-molded to form a green body having a cylindrical shape having a diameter of 28.5 mm and a thickness of 10 mm under a pressure of 7 MPa (71.38 kgf/cm²). The resulting green body was placed in a packaging container and vacuum packed, and subjected to a cold isostatic pressing (CIP) process at 176 MPa with water as the pressure medium using a CIP equipment (manufactured by Kobe Steel, Ltd.).

Step of Primary Sintering

The resulting green body was primary sintered by retaining to 1,400° C. and 0.9 MPa for 6 hours in a nitrogen gas atmosphere (nitrogen: 99% by volume or more) with a sintering furnace (manufactured by Fujidempa Kogyo Co., Ltd.), so as to provide a first sintered body. The resulting first sintered body was designated as a ceramic composite material. In the ceramic composite materials formed of the first sintered bodies of Examples 15 to 20 and Comparative Example 5, the content (% by mass) of the nitride fluorescent material, the content of the rare earth aluminate salt fluorescent material, and the content of the α-aluminum oxide are substantially equal to the mass ratio of the nitride fluorescent material, the mass ratio of the rare earth aluminate salt fluorescent material, and the mass ratio of the α-aluminum oxide, respectively, in the mixed powder or the green body.

Example 16

A first sintered body was obtained in the same manner as in Example 15 except that the amount of the nitride fluorescent material was 3 parts by mass (3% by mass based on 100% by mass of the mixed powder or the green body), and the amount of the rare earth aluminate salt fluorescent material was 17 parts by mass (17% by mass based on 100% by mass of the mixed powder or the green body), and the first sintered body was designated as a ceramic composite material.

Example 17

A first sintered body was obtained in the same manner as in Example 15 except that the amount of the nitride fluorescent material was 5 parts by mass (5% by mass based on 100% by mass of the mixed powder or the green body), and the amount of the rare earth aluminate salt fluorescent material was 15 parts by mass (15% by mass based on 100% by mass of the mixed powder or the green body), and the first sintered body was designated as a ceramic composite material.

Example 18

A first sintered body was obtained in the same manner as in Example 15 except that the amount of the nitride fluorescent material was 10 parts by mass (10% by mass based on 100% by mass of the mixed powder or the green body), and the amount of the rare earth aluminate salt fluorescent material was 10 parts by mass (10% by mass based on 100% by mass of the mixed powder or the green body), and the first sintered body was designated as a ceramic composite material.

Example 19

A first sintered body was obtained in the same manner as in Example 15 except that the amount of the nitride fluorescent material was 15 parts by mass (15% by mass based on 100% by mass of the mixed powder or the green body), and the amount of the rare earth aluminate salt fluorescent material was 5 parts by mass (5% by mass based on 100% by mass of the mixed powder or the green body), and the first sintered body was designated as a ceramic composite material.

Example 20

A first sintered body was obtained in the same manner as in Example 15 except that the amount of the nitride fluorescent material was 20 parts by mass (20% by mass based on 100% by mass of the mixed powder or the green body), and the rare earth aluminate salt fluorescent material was not contained, and the first sintered body was designated as a ceramic composite material.

Comparative Example 5

A first sintered body was obtained in the same manner as in Example 15 except that the amount of the rare earth aluminate salt fluorescent material was 20 parts by mass (20% by mass based on 100% by mass of the mixed powder or the green body), and the nitride fluorescent material was not contained, and the first sintered body was designated as a ceramic composite material.

Measurement of Relative Density of First Sintered Body

In Examples 15 to 20 and Comparative Example 5, the relative density of the first sintered body was measured. The results are shown in Table 4. The relative density of the first sintered body was calculated according to the equation (2), the equation (3-2), and the equation (4). The calculation was performed on the assumption that the true density of the nitride fluorescent material represented by $Ce_{0.15}La_{2.75}Si_6N_{11}$ was 4.78 g/cm$^3$, the true density of the rare earth aluminate salt fluorescent material represented by $(Y_{0.995}Ce_{0.005})_3Al_5O_{12}$ was 4.60 g/cm$^3$, and the true density of the α-aluminum oxide particles was 3.98 g/cm$^3$. The ceramic composite materials of Examples 15 to 20 and Comparative Example 5 were produced to have a relative density of the ceramic composite material in a range of from 93.1 g/cm$^3$ to 93.8 g/cm$^3$ for comparing the ceramic composite materials for the relative light emission intensity at the respective temperatures.

Measurement of Relative Light Emission Intensity corresponding to Temperature

The ceramic composite materials formed of the first sintered bodies of Examples 15 to 20 and Comparative Example 5 each were cut into a thickness of 300 μm with a wire saw, so as to provide a specimen. The specimen was placed on a heater, a xenon lamp was used as a light source, and light from the light source was introduced to a monochromator. The target wavelength was selected from the introduced light with the monochromator, with which the specimens were irradiated. The light emitted from the specimens having been heated to temperatures of 20° C., 100° C., 150° C., 200° C., 250° C., and 300° C. receiving the irradiated light was measured with a multi-channel spectrometer (PMA12, a trade name, manufactured by Hamamatsu Photonics K.K.), and the light emission intensity at the light emission peak wavelength in a wavelength range of 430 nm or more and 800 nm or less was measured. Assuming that the light emission intensity of light at a light emission peak wavelength in a wavelength range of 430 nm or more and 800 nm or less obtained from the specimen of the ceramic composite material of Example 20 at 20° C. was 100%, the light emission intensity of light at a light emission peak wavelength in a wavelength range of 430 nm or more and 800 nm or less obtained from the specimens at each of the temperatures was expressed in terms of relative light emission intensity (%). The relative light emission intensities of the specimens at 20° C. are shown in Table 4, and the relative light emission intensities of the specimens at 20° C., 100° C., 150° C., 200° C., 250° C., and 300° C. are shown in Table 5.

TABLE 4

|  | Nitride fluorescent material (% by mass) | Rare earth aluminate salt fluorescent material (% by mass) | Aluminum oxide (% by mass) | Relative density (%) | Relative light emission intensity at 20° C. (%) |
|---|---|---|---|---|---|
| Example 15 | 1 | 19 | 80 | 93.1 | 117.3 |
| Example 16 | 3 | 17 | 80 | 93.1 | 111.3 |
| Example 17 | 5 | 15 | 80 | 93.1 | 110.5 |
| Example 18 | 10 | 10 | 80 | 93.6 | 106.5 |
| Example 19 | 15 | 5 | 80 | 93.7 | 102.6 |
| Example 20 | 20 | 0 | 80 | 93.8 | 100.0 |
| Comparative Example 5 | 0 | 20 | 80 | 93.5 | 129.9 |

TABLE 5

|  |  | Comparative Example 5 | Example 15 | Example 16 | Example 17 | Example 18 | Example 19 | Example 20 |
|---|---|---|---|---|---|---|---|---|
| Nitride fluorescent material (% by mass) |  | 0 | 5 | 15 | 25 | 50 | 75 | 100 |
| Rare earth aluminate salt fluorescent material (% by mass) |  | 100 | 95 | 85 | 75 | 50 | 25 | 0 |
| Relative light emission intensity (%) | 20° C. | 129.9 | 117.3 | 111.3 | 110.5 | 106.5 | 102.6 | 100.0 |
|  | 50° C. | 129.0 | 116.5 | 110.5 | 109.7 | 104.9 | 101.4 | 99.1 |
|  | 100° C. | 127.1 | 113.5 | 108.4 | 108.3 | 104.2 | 100.0 | 98.1 |
|  | 150° C. | 120.5 | 110.0 | 105.7 | 104.4 | 101.0 | 97.4 | 96.1 |
|  | 200° C. | 104.9 | 98.7 | 96.6 | 94.0 | 91.0 | 91.3 | 90.3 |
|  | 250° C. | 72.5 | 70.8 | 71.9 | 70.3 | 71.2 | 72.3 | 76.0 |
|  | 300° C. | 42.5 | 41.7 | 44.2 | 47.4 | 48.4 | 51.9 | 54.2 |

The ceramic composite materials formed of the first sintered bodies of Examples 15 to 20 and Comparative Example 5 had the substantially equivalent relative densities. At 20° C., the ceramic composite material that had a larger content of the rare earth aluminate salt fluorescent material having a composition represented by $(Y_{0.995}Ce_{0.005})_3Al_5O_{12}$ had a higher relative light emission intensity, but at a high temperature of 150° C. or more, the ceramic composite materials of Examples 15 to 20 containing the nitride fluorescent material having a composition represented by $Ce_{0.15}La_{2.75}Si_6N_{11}$ were more suppressed in decrease of the relative light emission intensity than the ceramic composite material of Comparative Example 5 that did not contain the nitride fluorescent material. It was confirmed from the result that the ceramic composite material containing the nitride fluorescent material along with the rare earth aluminate salt fluorescent material or instead of the rare earth aluminate salt fluorescent material was more suppressed in decrease of the light emission intensity and retained the higher light emission intensity. In Table 5, the mass ratio (% by mass) of the nitride fluorescent material and the mass ratio (% by mass) of the rare earth aluminate salt fluorescent material are the mass ratio (% by mass) of the fluorescent materials based on the total amount of 100% by mass of the nitride fluorescent material and the rare earth aluminate salt fluorescent material.

Figure 6:
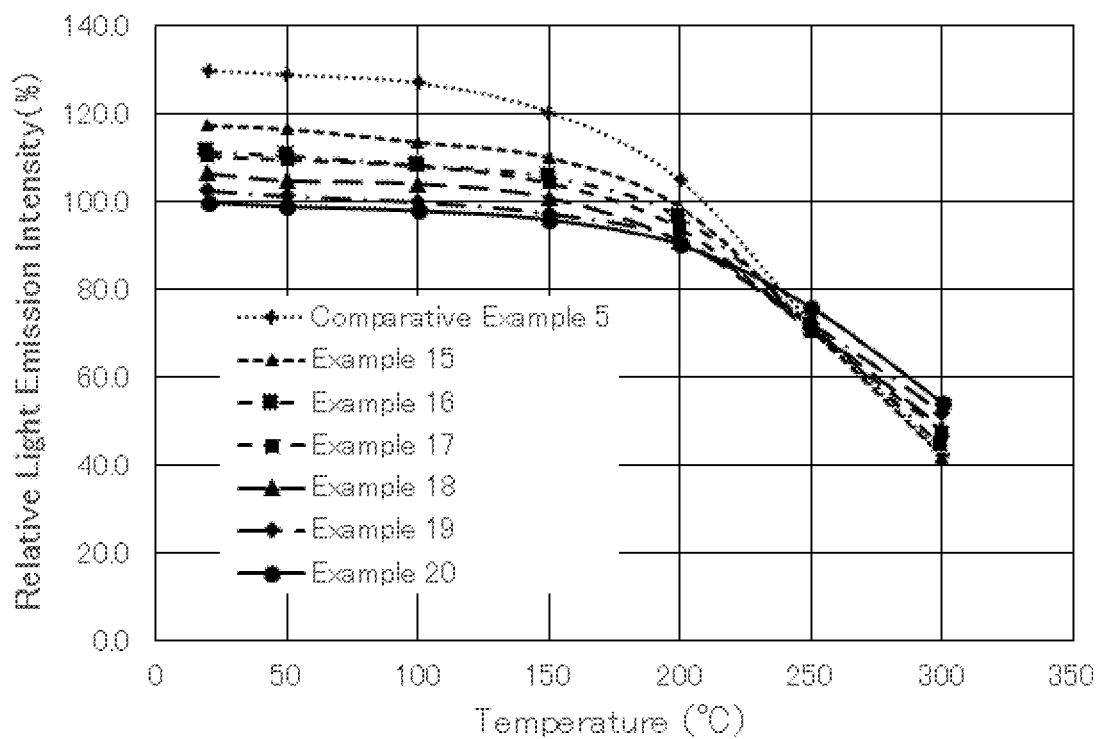
FIG. 6 is a graph showing the relationship between the temperature and the relative light emission intensity of the light emitting devices using the ceramic composite materials of Examples 15 to 20 and Comparative Example 5.

As shown in FIG. 6, at 300° C., the ceramic composite materials of Examples 16 to 20 had a higher relative light emission intensity than the ceramic composite material of Comparative Example 5 that did not contain the nitride fluorescent material, and the ceramic composite materials of Examples 15 to 20 were suppressed in decrease of the light emission intensity in a high temperature region of 150° C. or more.

The ceramic composite material according to the embodiment of the present disclosure can be applied to a ceramic composite material capable of converting a wavelength of light emitted from LED or LD, a material for a solid scintillator.

The invention claimed is:

1. A method for producing a ceramic composite material, comprising:
preparing a green body comprising a nitride fluorescent material having a composition represented by the following chemical formula (I), a rare earth aluminate salt fluorescent material having a composition represented by the following chemical formula (II) and aluminum oxide particles; and
performing primary sintering the green body at a temperature in a range of 1,250° C. or more and 1,600° C. or less to obtain a first sintered body:

$$M_wLn^1_xA_yN_z \qquad (I)$$

wherein in the chemical formula (I), M represents at least one element selected from the group consisting of Ce and Pr; $Ln^1$ represents at least one element selected from the group consisting of Sc, Y, La, Nd, Sm, Eu, Gd, Tb, Dy, Ho, Er, Tm, Yb, and Lu; A represents at least one element selected from the group consisting of Si and B; and w, x, y, and z each satisfy $0<w\leq1.0$, $2.5\leq x\leq3.5$, $5.5\leq y\leq6.5$, and $10\leq z\leq12$,

$$(Ln^2_{1-a}Ce_a)_3(Al_cGa_b)_5O_{12} \qquad (II)$$

wherein in the chemical formula (II), $Ln^2$ represents at least one element selected from the group consisting of Y, Gd, Lu, and Tb; and a, b, and c each satisfy $0<a\leq0.022$, $0\leq b\leq0.4$, $0<c\leq1.1$, and $0.9\leq b+c\leq1.1$.

2. The method for producing a ceramic composite material according to claim 1, further comprising performing secondary sintering the first sintered body by a hot isostatic pressing (HIP) treatment at a temperature in a range of 1,250° C. or more and 1,600° C. or less, so as to obtain a second sintered body.

3. The method for producing a ceramic composite material according to claim 1, wherein the primary sintering is performed at a temperature in a range of 1,300° C. or more and 1,500° C. or less.

4. The method for producing a ceramic composite material according to claim 2, wherein the secondary sintering is performed at a temperature in a range of 1,350° C. or more and 1,500° C. or less.

5. The method for producing a ceramic composite material according to claim 1, wherein the nitride fluorescent material has a median particle diameter in a range of 2 μm or more and 100 μm or less.

6. The method for producing a ceramic composite material according to claim 1, wherein the aluminum oxide particles have an average particle diameter in a range of 0.1 μm or more and 1.5 μm or less.

7. The method for producing a ceramic composite material according to claim 1, wherein in the step of preparing a green body, the nitride fluorescent material is used in an amount of 0.1% by mass or more and 70% by mass or less based on a total amount of 100% by mass of the nitride fluorescent material and the aluminum oxide particles.

8. The method for producing a ceramic composite material according to claim 1, wherein the aluminum oxide particles have a purity of aluminum oxide of 99.0% by mass or more.

9. The method for producing a ceramic composite material according to claim 1, wherein the rare earth aluminate salt fluorescent material has a median particle diameter in a range of 15 μm or more and 40 μm or less.

10. The method for producing a ceramic composite material according to claim 1, wherein in the step of preparing a green body, a total amount of the rare earth aluminate salt fluorescent material and the nitride fluorescent material is in a range of 0.2% by mass or more and 80% by mass or less based on 100% by mass of the green body.

11. The method for producing a ceramic composite material according to claim 1, wherein the first sintered body has a relative density of 80% or more.

12. The method for producing a ceramic composite material according to claim 2, wherein the second sintered body has a relative density of 90% or more.

13. A ceramic composite material comprising a nitride fluorescent material having a composition represented by the following chemical formula (I), a rare earth aluminate salt fluorescent material having a composition represented by the following chemical formula (II) and aluminum oxide, having a content of the nitride fluorescent material in a range of 0.1% by mass or more and 70% by mass or less based on a total amount of the nitride fluorescent material and the aluminum oxide, and a total amount of the nitride fluorescent material and the rare earth aluminate salt fluorescent material is in a range of 0.2% by mass or more and 80% by mass or less based on 100% by mass of the ceramic composite material:

$$M_wLn^1_xA_yN_z \qquad (I)$$

wherein in the chemical formula (I), M represents at least one element selected from the group consisting of Ce and Pr; $Ln^1$ represents at least one element selected from the group consisting of Sc, Y, La, Nd, Sm, Eu, Gd, Tb, Dy, Ho, Er, Tm, Yb, and Lu; A represents at least one element selected from the group consisting of Si and B; and w, x, y, and z each satisfy $0<w\leq 1.0$, $2.5\leq x\leq 3.5$, $5.5\leq y\leq 6.5$, and $10\leq z\leq 12$, $$(Ln^2{}_{1-a}Ce_a)_3(Al_cGa_b)_5O_{12} \quad (II)$$

wherein in the chemical formula (II), $Ln^2$ represents at least one element selected from the group consisting of Y, Gd, Lu, and Tb; and a, b, and c each satisfy $0<a\leq 0.022$, $0\leq b\leq 0.4$, $0<c\leq 1.1$, and $0.9\leq b+c\leq 1.1$.

14. The ceramic composite material according to claim 13, wherein the ceramic composite material has a relative density of 80% or more.

15. The ceramic composite material according to claim 13, wherein the ceramic composite material contains the nitride fluorescent material in an amount in a range of 15% by mass or more based on a total amount of 100% by mass of the rare earth aluminate fluorescent material and the nitride fluorescent material.

16. A light emitting device comprising the ceramic composite material according to claim 13 and a light emitting element having a light emission peak wavelength in a range of 350 nm or more and 500 nm or less.

* * * * *